US012787151B2

(12) United States Patent
Lee

(10) Patent No.: US 12,787,151 B2
(45) Date of Patent: Nov. 3, 2026

(54) CERAMIC SUBSTRATE UNIT AND METHOD FOR MANUFACTURING SAME

(71) Applicant: AMOGREENTECH CO., LTD., Gimpo-si (KR)

(72) Inventor: Jihyung Lee, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 277 days.

(21) Appl. No.: 18/841,294

(22) PCT Filed: Feb. 14, 2023

(86) PCT No.: PCT/KR2023/002094
§ 371 (c)(1),
(2) Date: Aug. 23, 2024

(87) PCT Pub. No.: WO2023/163439
PCT Pub. Date: Aug. 31, 2023

(65) Prior Publication Data

US 2025/0203751 A1 Jun. 19, 2025

(30) Foreign Application Priority Data

Feb. 24, 2022 (KR) ........................ 10-2022-0024255

(51) Int. Cl.

| | |
|---|---|
| ***H05K 1/02*** | (2006.01) |
| ***H05K 1/03*** | (2006.01) |
| ***H05K 1/181*** | (2026.01) |
| ***H05K 3/303*** | (2026.01) |
| ***H05K 3/38*** | (2006.01) |
| *H10W 40/22* | (2026.01) |

(Continued)

(52) U.S. Cl.
CPC ......... *H05K 1/0203* (2013.01); *H05K 1/0306* (2013.01); *H05K 1/181* (2013.01); *H05K 3/303* (2013.01); *H05K 3/38* (2013.01); *H05K 2201/066* (2013.01); *H10W 40/226* (2026.01); *H10W 70/479* (2026.01); *H10W 70/692* (2026.01)

(58) Field of Classification Search
CPC .. H05K 1/0203; H05K 1/0306; H05K 1/0272; H05K 2201/064; H05K 2201/06
See application file for complete search history.

(56) References Cited

U.S. PATENT DOCUMENTS 7,923,833 B2 4/2011 Furukawa et al.
10,211,068 B2 2/2019 Oi et al.
2022/0208697 A1 6/2022 Lee

FOREIGN PATENT DOCUMENTS

JP H09-260546 A 10/1997
JP 2003-133662 A 5/2003

(Continued)

OTHER PUBLICATIONS

KR Office Action dated Jul. 2, 2024 as received in Application No. 10-2022-0024255.

*Primary Examiner* — Jeremy C Norris
(74) *Attorney, Agent, or Firm* — Maschoff Brennan

(57) ABSTRACT

The present invention relates to a ceramic substrate unit and to a method for manufacturing same. The ceramic substrate has a plurality of line grooves, through which air flows, formed on an upper surface of a lower metal layer thereof, so that heat generated in a semiconductor chip can be released to the outside by air convection, and warping caused by a volume difference between an upper metal layer and the lower metal layer can be suppressed.

17 Claims, 6 Drawing Sheets

(51) Int. Cl.

| | |
|---|---|
| *H10W 70/40* | (2026.01) |
| *H10W 70/692* | (2026.01) |

(56) References Cited

FOREIGN PATENT DOCUMENTS

| | | | |
|---|---|---|---|
| JP | 2007-173405 | A | 7/2007 |
| KR | 10-2010-0068593 | A | 6/2010 |
| KR | 10-2017-0073618 | A | 6/2017 |
| KR | 10-2020-0127511 | A | 11/2020 |

[FIG. 1]
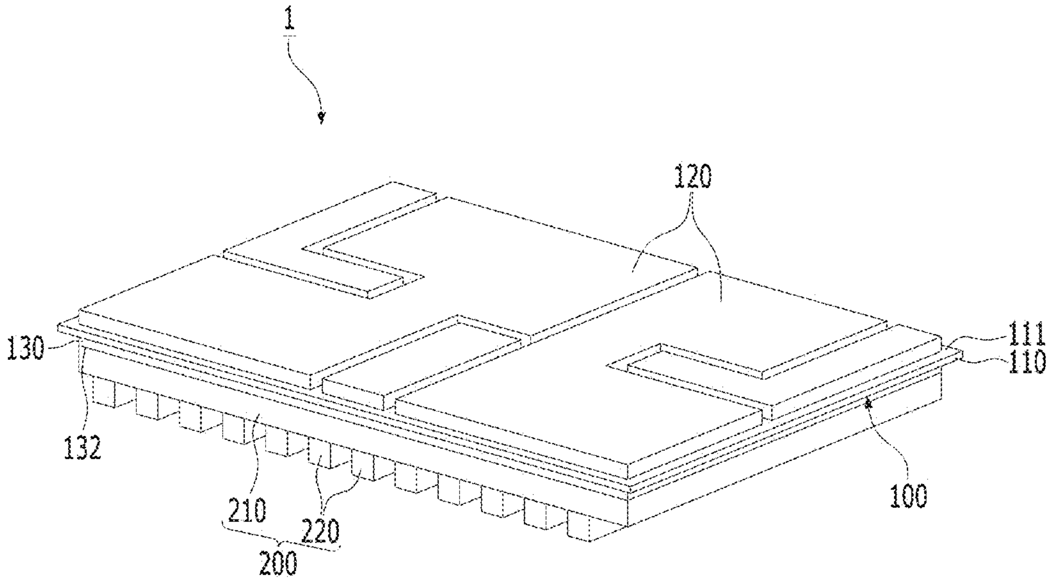

[FIG. 2]
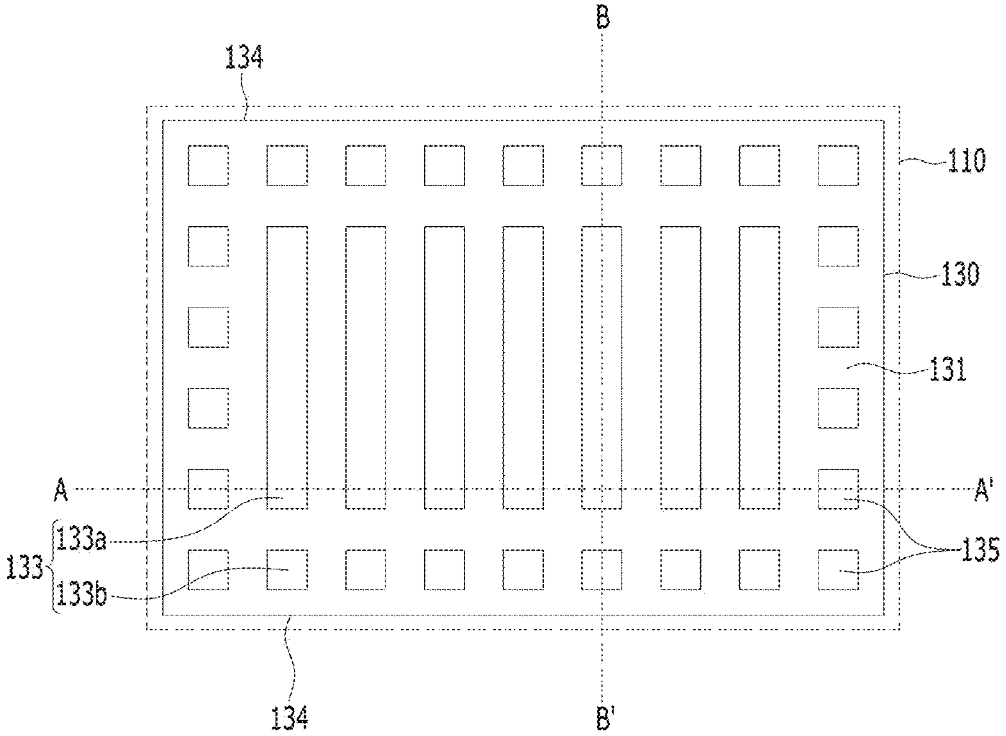

[FIG. 3]
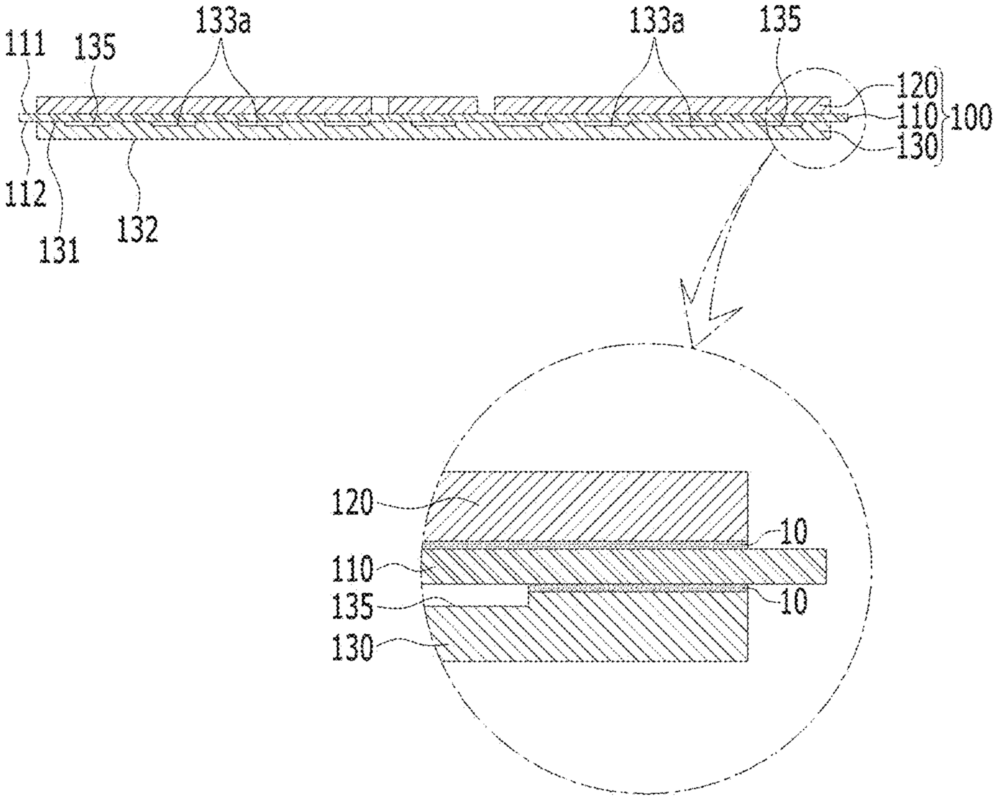

[FIG. 4]
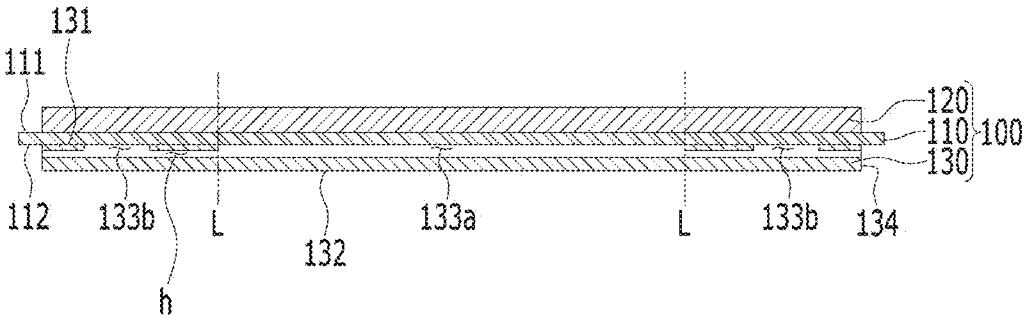
[FIG. 5]
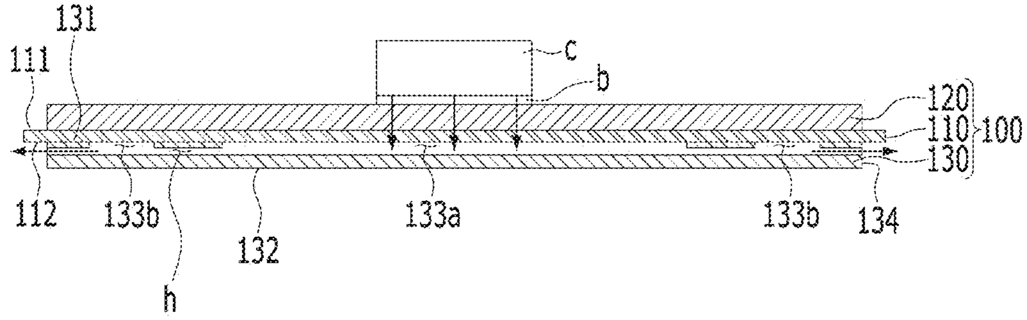

[FIG. 6]
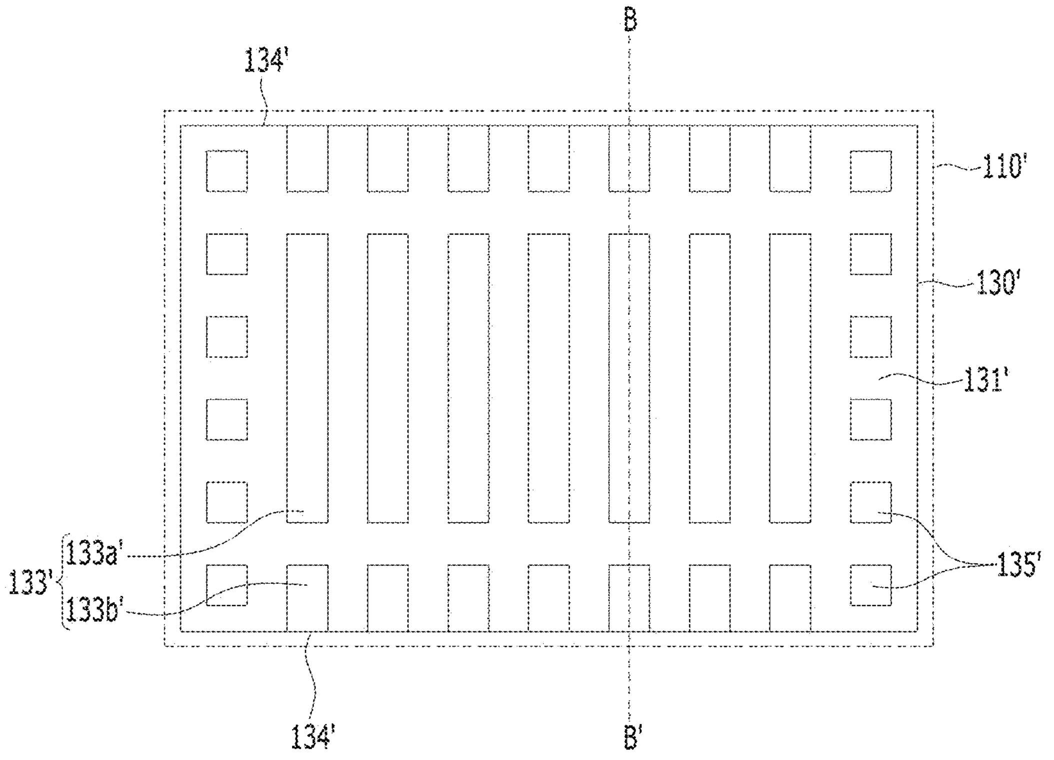
[FIG. 7]
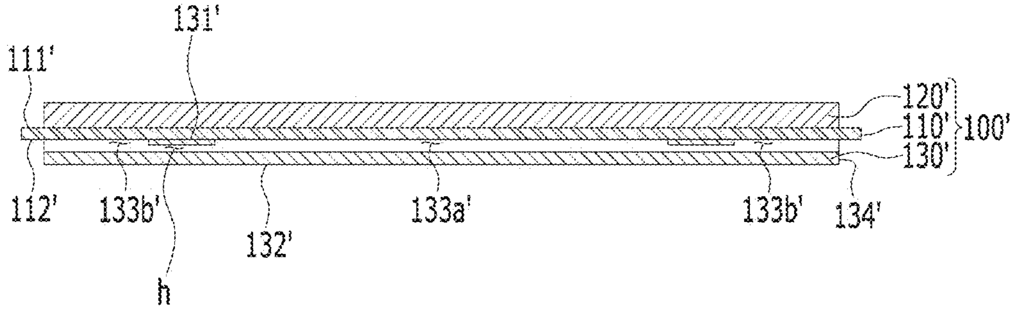

[FIG. 8]
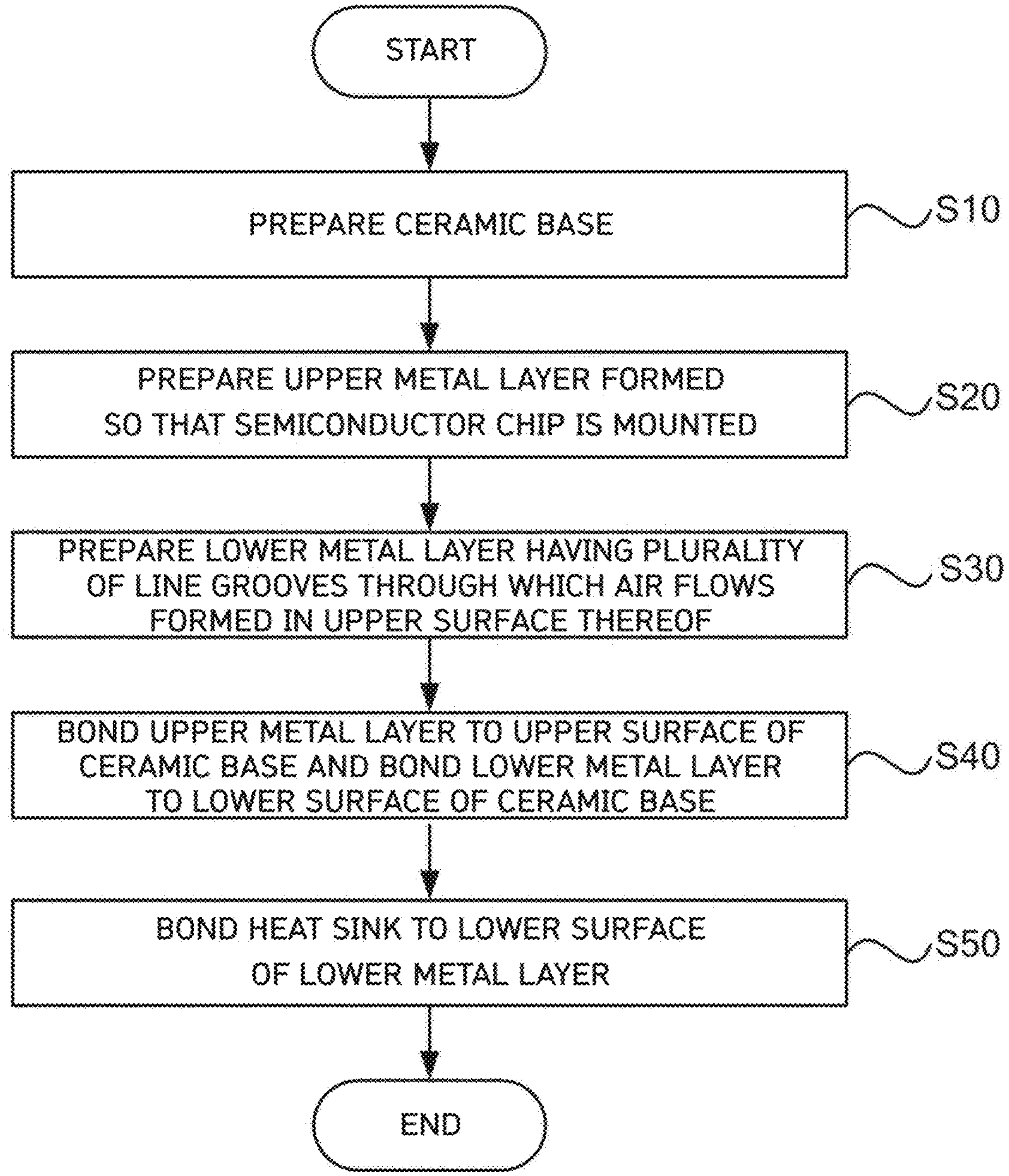

CERAMIC SUBSTRATE UNIT AND METHOD FOR MANUFACTURING SAME

TECHNICAL FIELD

The present disclosure relates to a ceramic substrate unit and a method of manufacturing the same, and more specifically, to a ceramic substrate unit capable of enhancing a heat dissipation effect by suppressing warpage of a ceramic substrate and improving bonding reliability, and a method of manufacturing the same.

BACKGROUND ART

In general, a heat sink in a ceramic substrate unit applied to a power module is formed in a quadrangular plate shape and is made of an aluminum or copper material. The heat sink may be bonded to a lower surface of the ceramic substrate and soldered to the lower surface of the ceramic substrate to facilitate heat dissipation. Since the heat sink is mainly made of a material with a coefficient of thermal expansion of 17.8 ppm/mK or more, there may occur warpage due to a difference in thermal expansion during a bonding process with the ceramic substrate. In addition, the solder paste may melt at a high temperature, causing warpage, defect, etc. of the heat sink.

As a solution to this, the ceramic substrate and the heat sink are bonded at a temperature of 250° C. or lower using AlSiC or a similar material. According to the conventional method of bonding the heat sink and the ceramic substrate, the heat sink is soldered to the ceramic substrate using a solder preform. In this case, the solder preform uses SAC305 made of a composition containing Sn, Ag, and Cu, and a soldering temperature ranges from 230 to 350° C.

However, in the conventional ceramic substrate unit, process cost is increased due to processes of solder paste, solder preform, and vacuum bonding equipment used for bonding, and warpage occurs at high temperatures due to a volume difference between upper and lower metal layers of the ceramic substrate and a coefficient of thermal expansion, resulting in bonding reliability and yield problems.

The matters described above in the background art are intended to help understanding of the background of the disclosure and may include matters not related to the known related art.

SUMMARY OF INVENTION

Technical Problem

The present disclosure has been made in efforts to solve the problems and is directed to providing a ceramic substrate unit and a method of manufacturing the same, in which can prevent the occurrence of warpage at high temperatures due to a volume difference between an upper metal layer and a lower metal layer of a ceramic substrate, enable high reliability bonding, and effectively dissipate heat generated from a semiconductor chip.

Solution to Problem

A ceramic substrate unit according to an embodiment of the present disclosure for achieving the object may include a ceramic substrate, and a heat sink bonded to the ceramic substrate, wherein the ceramic substrate may include an upper metal layer formed on an upper surface of a ceramic base and formed so that a semiconductor chip is mounted thereon, and a lower metal layer formed on a lower surface of the ceramic base and having the heat sink bonded to a lower surface thereof, and the lower metal layer may have a plurality of line grooves through which air flows formed in an upper surface facing the lower surface of the ceramic base.

Here, the line grooves may form an air gap between the lower surface of the ceramic base and an upper surface of the lower metal layer. The line grooves may be disposed in parallel at an interval. In addition, the line groove may be formed to have a constant width in an air flow direction.

The line groove may include a first groove disposed in a central area of the upper surface of the lower metal layer and formed to extend in an air flow direction, and a second groove connected to the first groove and open externally. In this case, heat generated from the semiconductor chip may be transferred to the first groove and discharged through the second grooves connected to both sides of the first groove.

The second groove may be open to side surfaces of the lower metal layer. In addition, the second groove may be formed by opening edges of side surfaces and an upper surface of the lower metal layer.

The lower metal layer may further include a plurality of recessed grooves formed in the remaining area of the upper surface, and the recessed grooves may form an air gap between the lower surface of the ceramic base and the upper surface of the lower metal layer.

A volume ratio obtained by dividing a total volume of the upper metal layer by a total volume of the lower metal layer may range from 0.9 to 1.1.

The ceramic substrate unit may include a brazing filler disposed between the upper surface of the ceramic base and a lower surface of the upper metal layer and between the lower surface of the ceramic base and the upper surface of the lower metal layer and bonding the upper metal layer and the lower metal layer to the ceramic base.

A method of manufacturing a ceramic substrate unit according to an embodiment of the present disclosure may include preparing a ceramic base, preparing an upper metal layer formed so that a semiconductor chip is mounted, preparing a lower metal layer having a plurality of line grooves through which air flows formed in an upper surface thereof, bonding the upper metal layer to an upper surface of the ceramic base and bonding the lower metal layer to a lower surface of the ceramic base, and bonding a heat sink to a lower surface of the lower metal layer.

In the preparing of the lower metal layer, the line groove may include a first groove disposed in a central area of the upper surface of the lower metal layer and formed to extend in an air flow direction, and a second groove connected to the first groove and open externally.

The preparing of the lower metal layer may include forming a plurality of recessed grooves in the remaining area of the upper surface of the lower metal layer.

The preparing of the lower metal layer may include forming the line grooves and the recessed grooves so that a volume ratio obtained by dividing a total volume of the upper metal layer by a total volume of the lower metal layer ranges from 0.9 to 1.1.

The bonding of the upper metal layer to the upper surface of the ceramic base and bonding of the lower metal layer to the lower surface of the ceramic base may include arranging a brazing filler between the upper surface of the ceramic base and a lower surface of the upper metal layer and between the lower surface of the ceramic base and the upper surface of the lower metal layer, and melting and brazing the brazing filler.

The arranging of the brazing filler may include arranging the brazing filler having a thickness of 5 μm or more and 100 μm or less in any one method of paste application, foil attachment, and a P-filler.

Advantageous Effects of Invention

According to the present disclosure, since the heat generated from the semiconductor chip is transferred to the line groove formed in the lower metal layer of the ceramic substrate and discharged to the outside by air convection, it is possible to maximize the heat dissipation effect.

In addition, according to the present disclosure, since the plurality of line grooves and recessed grooves are formed by etching the portion of the upper surface of the lower metal layer, the volume ratio of the upper metal layer and the lower metal layer may be controlled to be within the range of 0.9 to 1.1 without changing the total thickness of the lower metal layer, thereby suppressing the warpage caused by the volume difference between the upper metal layer and the lower metal layer.

In addition, according to the present disclosure, it is possible to suppress the warpage phenomenon caused by the volume difference between the upper metal layer and the lower metal layer, thereby enhancing bonding reliability and reducing the defect rate to increase productivity.

In addition, according to the present disclosure, even when high-temperature heat is generated from the semiconductor chip, the heat can be quickly cooled by the heat sink, and thus the semiconductor chip can be maintained at the constant temperature without deterioration.

BRIEF DESCRIPTION OF DRAWINGS

FIG. 1 is a perspective view showing a ceramic substrate unit according to one embodiment of the present disclosure.

FIG. 2 is a plan view showing a ceramic substrate of the ceramic substrate unit according to one embodiment of the present disclosure from which an upper metal layer and a ceramic base have been omitted.

FIG. 3 is a cross-sectional view of the ceramic substrate along line A-A' in FIG. 2.

FIG. 4 is a cross-sectional view of the ceramic substrate along line B-B' in FIG. 2.

FIG. 5 is a cross-sectional view showing a state in which a semiconductor chip has been mounted in FIG. 4.

FIG. 6 is a plan view showing a ceramic substrate of a ceramic substrate unit according to another embodiment of the present disclosure from which an upper metal layer and a ceramic base have been omitted.

FIG. 7 is a cross-sectional view of the ceramic substrate along line B-B' in FIG. 6.

FIG. 8 is a flowchart showing a method of manufacturing the ceramic substrate unit according to one embodiment of the present disclosure.

DESCRIPTION OF EMBODIMENTS

Hereinafter, exemplary embodiments according to the present disclosure will be described in detail with reference to the accompanying drawings.

The embodiments are provided to more completely describe the present disclosure to those skilled in the art, and the following embodiments may be modified in various different forms, and the scope of the present disclosure is limited to the following embodiments. Rather, the embodiments are provided to make the disclosure more faithful and complete and fully convey the spirit of the present disclosure.

Terms used herein are intended to describe specific embodiments and are not intended to limit the present disclosure. In addition, in the present specification, singular forms may include plural forms unless the context clearly indicates otherwise.

In the description of the embodiment, when each layer (film), area, pattern, or structure is described as being formed "on" or "under" a substrate, each layer (film), area, pad, or patterns, "on" and "under" include both cases of being formed "directly" or "indirectly with other elements interposed therebetween." In addition, in principle, the reference for "above" or "under" each layer are based on the drawing.

The drawings are only intended to help understanding of the spirit of the present disclosure and should not be construed as limiting the scope of the present disclosure by the drawings. In addition, in the drawings, a relative thickness and length, or a relative size may be exaggerated for convenience and clarity of description.

Hereinafter, embodiments of the present disclosure will be described in detail with reference to the accompanying drawings.

FIG. 1 is a perspective view showing a ceramic substrate unit according to one embodiment of the present disclosure, FIG. 2 is a plan view showing a ceramic substrate of the ceramic substrate unit according to one embodiment of the present disclosure from which an upper metal layer and a ceramic base have been omitted, FIG. 3 is a cross-sectional view of the ceramic substrate along line A-A' in FIG. 2, FIG. 4 is a cross-sectional view of the ceramic substrate along line B-B' in FIG. 2, and FIG. 5 is a cross-sectional view showing a state in which a semiconductor chip has been mounted in FIG. 4.

As shown in FIG. 1, a ceramic substrate unit 1 according to an embodiment of the present disclosure may include a ceramic substrate 100 and a heat sink 200 bonded to the ceramic substrate 100.

The ceramic substrate 100 may be an active metal brazing (AMB) substrate including a ceramic base 110 and upper and lower metal layers 120 and 130 formed on upper and lower surfaces of the ceramic base 110. In an embodiment, the AMB substrate will be described as an example, but the DBC substrate, the TPC substrate, or a direct brazed aluminum (DBA) substrate may be applied. The AMB substrate is most suitable in terms of durability and heat dissipation efficiency of heat generated from a semiconductor chip.

The ceramic base 110 of the ceramic substrate 100 may be, for example, any one of alumina ($Al_2O_3$), AlN, zirconia-reinforced alumina (ZTA), SiN, and $Si_3N_4$.

The upper metal layer 120 may be formed as an electrode pattern on an upper surface 111 of the ceramic base 110. For example, the upper metal layer 120 may be provided in the form of a metal foil, brazing-bonded to the upper surface 111 of the ceramic base 110, and then formed as an electrode pattern on which a semiconductor chip (not shown) is mounted by subsequent etching. In addition, the upper metal layer 120 may be formed to be thicker by plating, bonding, etc. For example, the upper metal layer 120 may be made of one of Cu, a Cu alloy (CuMo, etc.), OFC, EPT Cu, and Al. OFC is anoxic copper.

The lower metal layer 130 may be formed on a lower surface 112 of the ceramic base 110 and may have an upper surface 131 bonded to the lower surface 112 of the ceramic base 110 and a lower surface 132 bonded to the heat sink

200. The lower metal layer 130 may be, for example, made of one of Cu, a Cu alloy (CuMo, etc.), OFC, EPT Cu, and Al.

The lower surface 132 of the lower metal layer 130 may be formed as a flat surface to increase heat dissipation efficiency by increasing a bonding area with the heat sink 200. That is, the lower surface 132 of the lower metal layer 130 may be bonded to the heat sink 200 without an air gap.

Referring to FIGS. 2 and 3, the upper surface 131 of the lower metal layer 130 is a surface facing the lower surface of the ceramic base 110, and a plurality of line grooves 133 may be formed therein. The line grooves 133 may be formed by at least one of chemical etching and cutting machining. The line grooves 133 may form an air gap between the lower surface 112 of the ceramic base 110 and the upper surface 131 of the lower metal layer 130 and may be provided so that air flows therein. The line grooves 133 may be disposed in parallel at an interval and formed to have a constant width in an air flow direction to adjust an air flow.

Each of the plurality of line grooves 133 may include a first groove 133*a* and a second groove 133*b*. The first groove 133*a* may be disposed in a central area of the upper surface 131 of the lower metal layer 130 and formed to extend in the air flow direction. The second groove 133*b* may be connected to one side of the first groove 133*a* and open externally. Referring to FIG. 4, the second groove 133*b* may be open to a side surface 134 of the lower metal layer 130 and open externally. The first groove 133*a* and the second groove 133*b* may be distinguished by a virtual line L. That is, the second groove 133*b* may be disposed at both sides of the first groove 133*a*, and the second groove 133*b* may include a passage groove h to be connected to the first groove 133*a*, and heat may be transferred from the first groove 133*a* through the passage groove h.

Referring to FIG. 5, a semiconductor chip c such as SiC, GaN, Si, LED, or VCSEL may be mounted on the upper metal layer 120 of the ceramic substrate 100. The semiconductor chip c may be bonded to the upper surface of the upper metal layer 120 by a bonding layer b including solder or Ag paste. As marked by arrows in FIG. 5, heat generated from the semiconductor chip c may be transferred to the first groove 133*a* disposed in the central area of the upper surface 131 of the lower metal layer 130. Since the second groove 133*b* is connected to both sides of the first groove 133*a*, the heat transferred to the first groove 133*a* may be moved to the second groove 133*b* by air convection and discharged through the second groove 133*b*. As described above, even when the lower metal layer 130 is not in direct contact with the semiconductor chip c, the heat generated from the semiconductor chip c can be indirectly and smoothly dissipated by air convection through the line grooves 133.

As shown in FIGS. 2 and 3, the lower metal layer 130 may further include a plurality of recessed grooves 135 formed in the remaining area of the upper surface 131. The recessed grooves 135 may be formed by etching a portion of the upper surface 131 of the lower metal layer 130 in the thickness direction. Alternatively, the plurality of recessed grooves 135 may be formed by mechanically processing the portion of the upper surface of the lower metal layer 130. The plurality of recessed grooves 135 may form an air gap between the lower surface 112 of the ceramic base 110 and the upper surface 131 of the lower metal layer 130. The recessed groove 135 may be additionally formed near the line groove 133 to ensure that the lower metal layer 130 has a predetermined volume corresponding to a volume of the upper metal layer 120. That is, the recessed groove 135 may be additionally formed near the line groove 133 to control the volume ratio of the upper metal layer 120 and lower metal layer 130 to be within the range of 0.9 to 1.1, and a shape, number, arrangement, etc. thereof may be variously changed to adjust a volume of the lower metal layer 130. As an example, the recessed groove 135 may be a closed groove shape at all sides, but is not limited thereto, and the recessed groove 135 may be formed to be open externally like the line groove 133. In addition, the lower metal layer 130 may be formed to have a predetermined volume corresponding to the volume of the upper metal layer 120 with only the line groove 133 without the recessed groove 135.

The line groove 133 and the recessed groove 135 of the lower metal layer 130 can suppress the warpage phenomenon caused by the volume difference between the lower metal layer 130 and the upper metal layer 120 by adjusting the volume of the lower metal layer 130. When the upper surface 131 of the lower metal layer 130 is formed as a flat surface without the plurality of line grooves 133 and recessed grooves 133 like the lower surface 132, the volume difference is large compared to the total volume of the upper metal layer 120 formed as an electrode pattern, resulting in the warpage phenomenon of the ceramic substrate 100 in a high-temperature environment. This warpage accounts for a relatively large proportion of the total production volume, resulting in a problem of continuous production loss.

In addition, the upper metal layer 120 and the lower metal layer 130 are made of a material such as Cu and Al with excellent thermal conductivity, and since these materials have a coefficient of thermal expansion of 17.8 ppm/mK or more, there is a problem that warpage occurs significantly at a high temperature of 200° C. or higher. As described above, the ceramic substrate 100 warps depending on the sizes and shapes of the upper and lower metal layers 120 and 130, the coefficient of thermal expansion, etc.

Since the upper metal layer 120 of the ceramic substrate 100 is formed as a circuit pattern and is configured to mount a semiconductor chip, its shape, thickness, length, etc. are often designed to be fixed. Therefore, in the ceramic substrate unit 1 according to the embodiment of the present disclosure, by calculating the volume of the upper metal layer 120 bonded to the ceramic base 110 of the ceramic substrate 100 and forming the line grooves 133 and the recessed grooves 135 in the upper surface of the lower metal layer 130 to have a predetermined volume corresponding to the volume of the upper metal layer 120, it is possible to suppress the warpage phenomenon that occurs at a high temperature.

Specifically, the volume ratio obtained by dividing the total volume of the upper metal layer 120 by the total volume of the lower metal layer 130 is preferably designed to be within a range of 0.9 to 1.1 and to minimize warpage, the volume ratio is more preferably designed to be close to 1.0. Here, the total volume may be calculated by multiplying a total area by a thickness.

The thicknesses of the upper metal layer 120 and the lower metal layer 130 may range from 0.3 mm to 20 mm. Since the ceramic substrate unit 1 according to the present disclosure may be applied to the power module, the thicknesses of the upper metal layer 120 and the lower metal layer 130 may be designed in consideration of a thickness of the power module. The power module is provided with a semiconductor chip, the power module is sealed with an epoxy-based molding resin to protect the semiconductor chip from an external environment, and in this case, a molding mold is used, and thus the thicknesses of the upper metal layer 120 and the lower metal layer 130 may be designed in consideration of a height of the molding mold.

As described above, since the thicknesses of the upper metal layer 120 and the lower metal layer 130 are designed in consideration of a product, process conditions, heat dissipation, etc., it is difficult to change the same later.

The ceramic substrate unit 1 according to the present disclosure can solve a problem that it is difficult to suppress warpage due to the limitation in changing the thicknesses of the upper metal layer 120 and the lower metal layer 130. That is, in the ceramic substrate unit 1 according to the present disclosure, since the plurality of line grooves 133 and recessed grooves 135 are formed in the portion of the upper surface of the lower metal layer 130, the volume of the lower metal layer 130 can be reduced without changing the total thickness of the lower metal layer 130, and thus the volume ratio of the upper metal layer 120 and the lower metal layer 130 may be adjusted to be within the range of 0.9 to 1.1. As described above, according to the present disclosure, it is possible to suppress the warpage phenomenon caused by the volume difference between the upper metal layer 120 and the lower metal layer 130 by controlling the sizes (volumes) of the plurality of line grooves 133 and recessed grooves 135 formed in the lower metal layer 130.

Meanwhile, the ceramic substrate unit 1 according to the present disclosure may include a brazing filler 10 that is disposed between the upper surface 111 of the ceramic base 110 and the lower surface of the upper metal layer 120 and between the lower surface 112 of the ceramic base 110 and the upper surface 131 of the lower metal layer 130 and bonds the upper metal layer 120 and the lower metal layer 130 to the ceramic base 110. Here, as shown in FIG. 3, the brazing filler 10 may be disposed in an area of the upper surface of the lower metal layer 130 excluding the line grooves 133 and the recessed grooves 135. Therefore, the lower metal layer 130 may be bonded to the ceramic base 110 while maintaining a state in which the line grooves 133 and the recessed grooves 135 are air gaps.

The brazing filler 10 may be made of a material including at least one of Ag, Cu, AgCu, and AgCuTi. Here, Ag and Cu may serve to increase bonding strength by having high thermal conductivity and at the same time, increase heat dissipation efficiency by facilitating heat transfer. In addition, Ti can easily allow Ag and Cu to be attached to the bonding surface by having good wettability.

Meanwhile, the heat sink 200 may be used to dissipate heat generated from the semiconductor chip mounted on the upper metal layer 120 and made of a material capable of increasing heat dissipation efficiency. As an example, the heat sink 200 may be made of at least one of Cu, Al, AlSiC, CuMo, CuW, Cu/CuMo/Cu, Cu/Mo/Cu, and Cu/W/Cu, or a composite material thereof. Here, the materials of Cu, Al, AlSiC, CuMo, CuW, Cu/CuMo/Cu, Cu/Mo/Cu, and Cu/W/Cu may have excellent thermal conductivity, and the materials of AlSiC, CuMo, CuW, Cu/CuMo/Cu, Cu/Mo/Cu, and Cu/W/Cu may have low thermal expansion coefficients, thereby minimizing the occurrence of warpage when bonded to the ceramic substrate 100.

The heat sink 200 may be operated by any one of an air-cooled method or a water-cooled method. Here, for the air-cooled method, air may be supplied as refrigerant, and for the water-cooled method, cooling water may be supplied by being circulated as refrigerant by a pumping force. In the present embodiment, the slit-type heat sink 200 in which a plurality of bar-shaped protrusions 220 are horizontally disposed at intervals on a lower surface of a body 210 is shown, but the present disclosure is not limited thereto, and as the heat sink 200, various heat sinks such as a micro channel, pin fin, micro jet, and slit types may be bonded.

Although not shown, the heat sink 200 may be bonded to the lower metal layer 130 of the ceramic substrate 100 via a bonding layer (not shown). In this case, the bonding layer may be a brazing bonding layer or Ag sintering bonding layer made of a material including at least one of Ag, Cu, AgCu, and AgCuTi. When the bonding layer is a brazing bonding layer, the brazing bonding layer may be disposed between the lower metal layer 130 of the ceramic substrate 100 and the heat sink 200 and may integrally bond the ceramic substrate 100 and the heat sink 200 at a brazing temperature. The brazing temperature may be 450° C. or higher. Ag, AgCu, and AgCuTi may serve to increase bonding strength due to high thermal conductivity and at the same time, facilitate heat transfer between the ceramic substrate 100 and the heat sink 200, thereby increasing heat dissipation efficiency.

When the bonding layer is an Ag sintering bonding layer, the bonding layer may be made of a material including an Ag sintered body. For example, when the bonding layer is an Ag sintered body film, the Ag sintered body film may be disposed between the lower metal layer 130 of the ceramic substrate 100 and the heat sink 200, and in this state, by applying a pressure to the above assembly and hardening the same, the ceramic substrate 100 and the heat sink 200 may be integrally bonded. As described above, the ceramic substrate 100 and the heat sink 200 are airtightly bonded by a bonding method such as brazing bonding or Ag sintering bonding, thereby having high bonding strength and excellent high-temperature reliability.

FIG. 6 is a plan view showing a ceramic substrate of a ceramic substrate unit according to another embodiment of the present disclosure from which an upper metal layer and a ceramic base have been omitted, and FIG. 7 is a cross-sectional view of the ceramic substrate along line B-B' in FIG. 6.

As shown in FIGS. 6 and 7, in a ceramic substrate unit 1' according to another embodiment of the present disclosure, a lower metal layer 130' may be formed with a plurality of line grooves 133', in which the line groove 133' may include a first groove **133*a*' and a second groove 133*b*', and the second groove 133*b*' may be formed by opening edges of side surfaces 134' and an upper surface 131' of the lower metal layer 130'. As described above, when the second groove 133*b*' is formed to be open at the edges of the upper surface 131' as well as the side surfaces 134' of the lower metal layer 130', etching processing or machine processing for forming the second groove 133*b*' can be more easily performed. That is, in a process of forming the second groove 133*b*', since the second groove 133*b*' is formed by removing portions of the side surfaces 134' together without leaving the edge of the upper surface 131' of the lower metal layer 130'**, processing can be more easily performed.

FIG. 8 is a flowchart showing a method of manufacturing the ceramic substrate unit according to one embodiment of the present disclosure.

The method of manufacturing the ceramic substrate unit according to one embodiment of the present disclosure may include preparing the ceramic base 110 (S10), preparing the upper metal layer 120 configured so that a semiconductor chip is mounted (S20), preparing the lower metal layer 130 in which the plurality of line grooves 133 through which air flows are formed in the upper surface thereof (S30), bonding the upper metal layer 120 to the upper surface 111 of the ceramic base 110 and bonding the lower metal layer 130 to the lower surface 112 of the ceramic base 110 (S40), and bonding the heat sink 200 to the lower surface of the lower metal layer 130 (S50). Here, each operation may be performed sequentially or performed in a reversed order, and performed substantially at the same time.

In the preparing of the ceramic base 110 (S10), the ceramic base 110 may be any one of alumina ($Al_2O_3$), AlN, SiN, $Si_3N_4$, and zirconia toughened alumina (ZTA), but is not limited thereto.

In the preparing of the upper metal layer 120 (S20), the upper metal layer 120 may be provided in a circuit pattern shape. In addition, the upper metal layer 120 may be provided in the form of a metal foil, brazing-bonded to the upper surface of the ceramic base 110, and then formed as an electrode pattern on which a semiconductor chip is mounted by etching. For example, the upper metal layer 120 may be made of one of Cu, a Cu alloy (CuMo, etc.), OFC, EPT Cu, and Al.

In the preparing of the lower metal layer 130 (S30), the lower surface 132 of the lower metal layer 130 may be formed as a flat surface to increase heat dissipation efficiency by increasing the bonding area with the heat sink 200. The lower surface 132 of the lower metal layer 130 may be bonded to the heat sink 200 without an air gap. On the other hand, the upper surface 131 of the lower metal layer 130 may be formed with the plurality of line grooves 133 through which air flows. The line grooves 133 may form an air gap between the lower surface 112 of the ceramic base 110 and the upper surface 131 of the lower metal layer 130. The line groove 133 may be formed by at least one of chemical etching and mechanical machining.

In the preparing of the lower metal layer 130 (S30), the line groove 133 may include a first groove 133*a* disposed in the central area of the upper surface 131 of the lower metal layer 130 and formed to extend in an air flow direction, and a second groove 133*b* connected to one side of the first groove 133*a* and open externally. The heat generated from the semiconductor chip mounted on the upper metal layer 120 may be transferred to the first groove 133*a*, and the heat may be moved to the second groove 133*b* by air convection and discharged through the second groove 133*b*. Therefore, the lower metal layer 130 may smoothly dissipate the heat generated from the semiconductor chip by air convection through the line groove 133.

The preparing of the lower metal layer 130 (S30) may include forming the plurality of recessed grooves 135 in the remaining area of the upper surface 131 of the lower metal layer 130. Here, the recessed groove 135 may be formed by etching a portion of the upper surface 131 of the lower metal layer 130 in the thickness direction. Alternatively, the plurality of recessed grooves 135 may be formed by mechanically processing the portion of the upper surface of the lower metal layer 130. The recessed groove 135 may be a closed groove shape at all sides, but is not limited thereto, and the recessed groove 135 may be formed to be open externally like the line groove 133. The recessed groove 135 may be additionally formed near the line groove 133 to have a predetermined volume corresponding to the volume of the upper metal layer 120, and a shape, number, arrangement, etc. thereof may be variously changed to adjust the volume of the lower metal layer 130.

The preparing of the lower metal layer 130 (S30) may include forming the line grooves 133 and the recessed grooves 135 so that the volume ratio obtained by dividing the total volume of the upper metal layer 120 by the total volume of the lower metal layer 130 ranges from 0.9 to 1.1. As described above, in the method of manufacturing the ceramic substrate unit according to the present disclosure, since the plurality of line grooves 133 and recessed grooves 135 are formed by etching the portion of the upper surface of the lower metal layer 130, the volume of the lower metal layer 130 can be adjusted without changing the total thickness of the lower metal layer 130, and thus the volume ratio of the upper metal layer 120 and the lower metal layer 130 may be adjusted to be within the range of 0.9 to 1.1. As described above, the volume ratio of the upper metal layer 120 and the lower metal layer 130 may be controlled to be within a specific range, thereby suppressing the warpage phenomenon at a high temperature.

The bonding of the upper metal layer 120 to the upper surface 111 of the ceramic base 110 and bonding of the lower metal layer 130 to the lower surface 112 of the ceramic base 110 (S40) may include arranging the brazing filler 10 between the upper surface 111 of the ceramic base 110 and the lower surface of the upper metal layer 120 and between the lower surface 112 of the ceramic base 110 and the upper surface 131 of the lower metal layer 130 (S41), and melting and brazing the brazing filler 10 (S42).

In the arranging of the brazing filler 10 (S41), the brazing filler 10 may be disposed between the upper surface 111 of the ceramic base 110 and the lower surface of the upper metal layer 120 and between the lower surface 112 of the ceramic base 110 and the upper surface 131 of the lower metal layer 130 and as shown in FIG. 3, disposed in an area of the upper surface of the lower metal layer 130 excluding the line grooves 133 and the recessed grooves 135. Therefore, the lower metal layer 130 may be bonded to the ceramic base 110 while maintaining a state in which the line grooves 133 and the recessed grooves 135 are air gaps.

The arranging of the brazing filler 10 (S41) may include arranging the brazing filler 10 having a thickness of 5 μm or more and 100 μm or less in any one method of paste application, foil attachment, and P-filler. The brazing filler 10 may be made of a material including at least one of Ag, Cu, AgCu, and AgCuTi. The brazing S42 may be performed at 450° C. or higher, preferably, in a range of 780 to 900° C., and an upper weight or pressure may be applied to increase bonding strength during brazing. Since the brazing bonding does not require vacuum bonding equipment, etc., as with the use of solder preform, the process can be simplified, and by applying the upper weight or pressure, pore defects are prevented and the bonding strength is increased, thereby achieving high bonding reliability.

The bonding of the heat sink 200 (S50) may include bonding the heat sink 200 to the lower metal layer 130 via the bonding layer (not shown) formed between the lower metal layer 130 of the ceramic substrate 100 and the heat sink 200, and the bonding layer may be made of a material including at least one of Ag, Cu, AgCu, and AgCuTi or a material including an Ag sintered body. When the bonding layer is a brazing bonding layer made of the material including at least one of Ag, Cu, AgCu, and AgCuTi, the brazing bonding layer may be disposed between the lower metal layer 130 and the heat sink 200 and may integrally bond the ceramic substrate 100 and the heat sink 200 at a brazing temperature. The bonding layer may be formed by any one method of plating, paste application, and foil attachment and may have a thickness of about 5 to 100 μm. The brazing bonding may be performed at 450° C. or higher, preferably, in a range of 780 to 900° C., and pressing by a jig may be performed during brazing to increase bonding strength.

When the bonding layer is an Ag sintering bonding layer, the bonding layer may be made of a material including an Ag sintered body. For example, when the bonding layer is an Ag sintered body film, the Ag sintered body film may be disposed between the lower metal layer 130 and the heat sink 200, and in this state, by applying a pressure to the above assembly and hardening the same, the ceramic substrate 100 and the heat sink 200 may be integrally bonded.

The above-described ceramic substrate unit according to the present disclosure can secure both multiple and large amount of connections of the semiconductor chip and the heat dissipation effect and further improve the performance of the power modules.

The above-described ceramic substrate unit according to the present disclosure can be applied to various module parts used for high power in addition to the power module.

The above description is merely the exemplary description of the technical spirit of the present disclosure, and those skilled in the art to which the present disclosure pertains will be able to variously modify and change the present disclosure without departing from the essential characteristics of the present disclosure. Therefore, the embodiments disclosed in the present disclosure are not intended to limit the technical spirit of the present disclosure, but intended to describe the same, and the scope of the technical spirit of the present disclosure is not limited by these embodiments. The scope of the present disclosure should be construed by the appended claims, and all technical spirits within the equivalent scope should be construed as being included in the scope of the present disclosure.

The invention claimed is:

1. A ceramic substrate unit comprising:

a ceramic substrate; and a heat sink bonded to the ceramic substrate, wherein the ceramic substrate includes:

an upper metal layer formed on an upper surface of a ceramic base and formed so that a semiconductor chip is mounted thereon; and a lower metal layer formed on a lower surface of the ceramic base and having the heat sink bonded to a lower surface thereof, and the lower metal layer has a plurality of line grooves through which air flows formed in an upper surface facing the lower surface of the ceramic base.

2. The ceramic substrate unit of claim 1, wherein the line grooves form an air gap between the lower surface of the ceramic base and an upper surface of the lower metal layer.

3. The ceramic substrate unit of claim 1, wherein the line grooves are disposed in parallel at an interval.

4. The ceramic substrate unit of claim 1, wherein the line groove is formed to have a constant width in an air flow direction.

5. The ceramic substrate unit of claim 1, wherein the line groove includes:

a first groove disposed in a central area of the upper surface of the lower metal layer and formed to extend in an air flow direction; and a second groove connected to the first groove and open externally.

6. The ceramic substrate unit of claim 5, wherein heat generated from the semiconductor chip is transferred to the first groove and discharged through the second grooves connected to both sides of the first groove.

7. The ceramic substrate unit of claim 5, wherein the second groove is open to side surfaces of the lower metal layer.

8. The ceramic substrate unit of claim 5, wherein the second groove is formed by opening edges of side surfaces and an upper surface of the lower metal layer.

9. The ceramic substrate unit of claim 5, wherein the lower metal layer further includes a plurality of recessed grooves formed in the remaining area of the upper surface, and the recessed grooves form an air gap between the lower surface of the ceramic base and the upper surface of the lower metal layer.

10. The ceramic substrate unit of claim 1, wherein a volume ratio obtained by dividing a total volume of the upper metal layer by a total volume of the lower metal layer ranges from 0.9 to 1.1.

11. The ceramic substrate unit of claim 1, comprising a brazing filler disposed between the upper surface of the ceramic base and a lower surface of the upper metal layer and between the lower surface of the ceramic base and the upper surface of the lower metal layer and bonding the upper metal layer and the lower metal layer to the ceramic base.

12. A method of manufacturing a ceramic substrate unit, the method comprising:

preparing a ceramic base;

preparing an upper metal layer formed so that a semiconductor chip is mounted;

preparing a lower metal layer having a plurality of line grooves through which air flows formed in an upper surface thereof;

bonding the upper metal layer to an upper surface of the ceramic base and bonding the lower metal layer to a lower surface of the ceramic base; and bonding a heat sink to a lower surface of the lower metal layer.

13. The method of claim 12, wherein in the preparing of the lower metal layer, the line groove includes:

a first groove disposed in a central area of the upper surface of the lower metal layer and formed to extend in an air flow direction; and a second groove connected to the first groove and open externally.

14. The method of claim 13, wherein the preparing of the lower metal layer includes forming a plurality of recessed grooves in the remaining area of the upper surface of the lower metal layer.

15. The method of claim 14, wherein the preparing of the lower metal layer includes forming the line grooves and the recessed grooves so that a volume ratio obtained by dividing a total volume of the upper metal layer by a total volume of the lower metal layer ranges from 0.9 to 1.1.

16. The method of claim 12, wherein the bonding of the upper metal layer to the upper surface of the ceramic base and bonding of the lower metal layer to the lower surface of the ceramic base includes:

arranging a brazing filler between the upper surface of the ceramic base and a lower surface of the upper metal layer and between the lower surface of the ceramic base and the upper surface of the lower metal layer; and melting and brazing the brazing filler.

17. The method of claim 16, wherein the arranging of the brazing filler includes arranging the brazing filler having a thickness of 5 μm or more and 100 μm or less in any one method of paste application, foil attachment, and a P-filler.

* * * * *